United States Patent
Sylvester

(10) Patent No.: US 10,950,843 B2
(45) Date of Patent: Mar. 16, 2021

(54) ELECTRIC BATTERIES

(71) Applicant: DUKOSI LIMITED, Penicuik (GB)

(72) Inventor: Joel Sylvester, Penicuik (GB)

(73) Assignee: DUKOSI LIMITED, Edinburgh (GB)

( * ) Notice: Subject to any disclaimer, the term of this patent is extended or adjusted under 35 U.S.C. 154(b) by 37 days.

(21) Appl. No.: 16/300,933

(22) PCT Filed: May 12, 2017

(86) PCT No.: PCT/GB2017/051337
§ 371 (c)(1),
(2) Date: Nov. 12, 2018

(87) PCT Pub. No.: WO2017/194966
PCT Pub. Date: Nov. 16, 2017

(65) Prior Publication Data
US 2019/0165354 A1    May 30, 2019

(30) Foreign Application Priority Data
May 13, 2016 (GB) ..................... 1608491

(51) Int. Cl.
*H01M 2/30* (2006.01)
*H01M 2/10* (2006.01)
(Continued)

(52) U.S. Cl.
CPC .......... *H01M 2/30* (2013.01); *G01R 31/3828* (2019.01); *G01R 31/3842* (2019.01);
(Continued)

(58) Field of Classification Search
None
See application file for complete search history.

(56) References Cited

U.S. PATENT DOCUMENTS

| 2008/0233471 A1 | 9/2008 | Aumayer et al. |
| 2009/0132188 A1 | 5/2009 | Watanabe |

(Continued)

FOREIGN PATENT DOCUMENTS

| CN | 101441251 A | 5/2009 |
| CN | 101782407 A | 7/2010 |

(Continued)

OTHER PUBLICATIONS https://batteryuniversity.com/index.php/learn/archive/pouch_cell_small_but_not_trouble_free; pp. 1-2.

(Continued)

*Primary Examiner* — Sarah A. Slifka
(74) *Attorney, Agent, or Firm* — Finnegan, Henderson, Farabow, Garrett & Dunner LLP

(57) ABSTRACT

The present invention relates to an electric battery (10). The electric battery (10) comprises plural battery cells (12), with each battery cell comprising a container. The container contains an electrochemical arrangement. Each battery cell (12) comprises positive and negative terminals of sheet form which extend from the electrochemical arrangement. The electric battery further comprises plural measurement arrangements (14), with each of the plural measurement arrangements being electrically coupled to each of two spaced apart locations on one of the positive and negative terminals of a respective one of the plural battery cells. Each of the plural measurement arrangements (14) is configured to measure potential difference between the two spaced apart locations.

25 Claims, 4 Drawing Sheets

(51) Int. Cl.
*H01M 2/20* (2006.01)
*H01M 10/42* (2006.01)
*H01M 10/48* (2006.01)
*G01R 31/3842* (2019.01)
*G01R 31/396* (2019.01)
*G01R 31/3828* (2019.01)
*G01R 31/374* (2019.01)

(52) U.S. Cl.
CPC ........ *G01R 31/396* (2019.01); *H01M 2/1061* (2013.01); *H01M 2/1077* (2013.01); *H01M 2/202* (2013.01); *H01M 10/425* (2013.01); *H01M 10/482* (2013.01); *H01M 10/486* (2013.01); *G01R 31/374* (2019.01); *H01M 2010/4271* (2013.01)

(56) References Cited

U.S. PATENT DOCUMENTS

| | | |
|---|---|---|
| 2013/0113507 A1 | 5/2013 | Danesh et al. |
| 2015/0355244 A1 | 12/2015 | Sato |
| 2015/0369877 A1 | 12/2015 | Frenzel et al. |
| 2016/0087252 A1 | 3/2016 | Hong et al. |
| 2017/0062878 A1 | 3/2017 | Povey et al. |
| 2017/0077722 A1 | 3/2017 | Jung |

FOREIGN PATENT DOCUMENTS

| | | |
|---|---|---|
| CN | 203481788 U | 3/2014 |
| CN | 105008947 A | 10/2015 |
| CN | 105324673 A | 2/2016 |
| EP | 2933643 | 10/2015 |
| KR | 20150110427 | 10/2015 |
| WO | WO 2015147527 A1 | 10/2015 |
| WO | WO 2015/166290 A1 | 11/2015 |

OTHER PUBLICATIONS

International Search Report of Counterpart PCT International Application No. PCT/GB2017/051337.
The First Office Action issued by The State Intellectual Property Office of People's Republic of China in related Application No. CN 201780028726.8, dated Oct. 31, 2019 (12 pgs.).
The Second Office Action issued by The State Intellectual Property Office of People's Republic of China in related Application No. CN 201780028726.8, dated Mar. 20, 2020 (13 pgs.).
The Third Office Action issued by The State Intellectual Property Office of People's Republic of China in related Application No. CN 201780028726.8, dated May 28, 2020 (25 pgs.).
The First Search Report issued by The State Intellectual Property Office of People's Republic of China in related Application No. CN 201780028726.8, dated Oct. 22, 2019 (1 pg.).
The Second Search Report issued by The State Intellectual Property Office of People's Republic of China in related Application No. CN 201780028726.8, dated Mar. 15, 2020 (1 pg.).
The Third Search Report issued by The State Intellectual Property Office of People's Republic of China in related Application No. CN 201780028726.8, dated May 21, 2020 (1 pg.).
Communication pursuant to Article 94(3) EPC issued by the European Patent Office in related Patent Application No. 17 728 916.2, dated Nov. 8, 2019 (10 pgs.).

ELECTRIC BATTERIES

FIELD OF THE INVENTION

The present invention relates to an electric battery configured to measure current sourced from or sunk by the electric battery and more particularly but not exclusively to an electric battery comprising plural battery cells, the electric battery being configured to measure current sourced from or sunk by each of at least one of the plural battery cells.

BACKGROUND ART

Lithium-ion battery cells have seen widespread use in small consumer devices such as laptop computers and mobile telephones. Lithium-ion batteries have recently begun to supplant conventional batteries in applications having greater electrical energy demands, such as electrical vehicles and static electricity generation apparatus. Lithium-ion batteries are seeing increased use on account of their normally superior performance over conventional batteries, such as lead-acid and NiMH batteries, in particular in respect of energy storage density and power density. To meet electrical energy demand in such larger energy demand applications a battery is typically comprised of plural lithium-ion battery cells which are arranged in at least one of series and parallel depending on current and voltage requirements. Lithium-ion batteries can be dangerous under certain conditions on account of their containing flammable material. Safe and effective use of a lithium-ion battery normally requires operation of the battery within its Safe Operating Area (SOA). Considering operation within a SOA further, most lithium-ion cells can be damaged if discharged below a certain voltage or if charged or discharged at too high a current. In addition there is often the lesser constraint of a Normal Operating Area (NOA). Breaching the NOA can result in reduction in capacity or cell life over time. These challenges are compounded by the multi-cell configuration of the typical lithium-ion battery wherein unevenness of the state of charge can arise between cells. Careful management by way of a battery management system (BMS) is therefore normally required to provide for safe and effective operation.

Battery management systems for lithium-ion battery arrangements are known. Such a battery management system typically makes measurements of properties such as current, voltage and temperature in a battery and makes determinations concerning safe and effective operation based on the measurements. Where current is measured either a discrete sense resistor or a Hall Effect device is used.

The present inventors have become appreciative of shortcomings in known approaches to measurement of current sourced from or sunk by electric batteries. The present invention has been devised in light of the inventors' appreciation of such shortcomings. It is therefore an object for the present invention to provide an electric battery comprising plural battery cells and a measurement arrangement configured to provide for measurement of current sourced from or sunk by each of at least one of the plural battery cells.

STATEMENT OF INVENTION

According to a first aspect of the present invention there is provided an electric battery comprising:
plural battery cells, each battery cell comprising a container, which contains an electrochemical arrangement, and positive and negative terminals of sheet form extending from the electrochemical arrangement; and
plural measurement arrangements, each of the plural measurement arrangements being electrically coupled to each of two spaced apart locations on one of the positive and negative terminals of a respective one of the plural battery cells, the measurement arrangement being configured to measure potential difference between the two spaced apart locations.

The electric battery comprises plural battery cells. Each of the plural battery cells comprises a container. The container contains an electrochemical arrangement. The container may be sealed. The electrochemical arrangement may be operative to generate electrical energy from chemical reaction. Positive and negative terminals of sheet form extend from the electrochemical arrangement. The electric battery further comprises plural measurement arrangements, each of the plural measurement arrangements being electrically coupled to each of two spaced apart locations on one of the positive and negative terminals of a respective one of the plural battery cells. The measurement arrangement is configured to measure potential difference between the two spaced apart locations.

Measurement of potential difference between the two spaced apart locations may provide for determination of current passing between the two spaced apart locations and hence current sourced from or sunk by the battery cell. Current may be sourced from the battery cell when the battery cell is operative, perhaps along with the other battery cells, to provide electrical power. Current may be sunk by the battery cell when the battery cell is being charged.

The current passing between the two spaced apart locations may be determined in dependence on the measured potential difference and a resistance between the two spaced apart locations. The terminal of the electric battery may therefore be operative as a parasitic resistance whereby no additional sense resistance, such as a discrete resistor, is required to sense current flowing from or to the battery cell. The current may be determined in dependence on Ohm's Law such that $I=V/R$, where V is the measured potential difference and R is the resistance between the two spaced apart locations.

The resistance between the two spaced apart locations may be predetermined. The resistance may be determined in dependence on at least one of a material property of the terminal and dimensions of the terminal. The material property of the terminal may be bulk resistivity, $\rho$, of the terminal. The dimensions of the terminal may comprise length of the terminal, width of the terminal and thickness of the terminal. More specifically the dimensions of the terminal may be expressed as $L/(t \cdot W)$, where L is length, t is thickness and W is width. The resistance may be predetermined on the basis of $R=(\rho \cdot L)/(t \cdot W)$. The resistance may be predetermined before use of the electrical battery such as during a calibration phase. The predetermined resistance may be stored in data storage. The data storage may be comprised in the measurement arrangement.

Bulk resistivity, $\rho$, varies with temperature. Often the temperature of the terminal varies to an extent sufficient to merit taking variation of bulk resistivity with temperature into account. The electric battery may therefore comprise a temperature sensor disposed so as to sense temperature in the vicinity of the terminal. The measurement arrangement may be configured to adjust bulk resistivity, $\rho$, for sensed temperature. More specifically the measurement arrangement may comprise a look up table of bulk resistivity, $\rho$, against temperature. The look up table may be stored in data storage. The electric battery may comprise plural temperature sensors, each of the plural temperature sensors being disposed so as to sense temperature in the vicinity of a terminal of a respective one of the plural battery cells.

For a terminal of given width and thickness the measurement arrangement may be coupled to the terminal at two locations which are spaced apart from each other by a predetermined amount to thereby establish a length of resistance of the terminal between the two locations whereby the resistance of the terminal between the two locations is predetermined. It may be desirable to have a smaller separation between the two locations than is afforded by the given dimensions of the terminal. This issue may be addressed if at least one of the width and the thickness of the terminal is reduced by a corresponding amount. Reduction in width may be more practical than reduction in width. The terminal may therefore be of non-uniform width. More specifically the terminal may be narrower between the two spaced apart locations than at the two spaced apart locations or on each side of the two spaced apart locations.

An electric battery may comprise first and second bus bars to which the positive and negative terminals of the plural battery cells are electrically connected. The electric battery may be configured such that one of the two locations at which the measurement arrangement is electrically coupled to the terminal is a bus bar and more specifically one of the first and second bus bars.

Each of the positive and negative terminals may comprise conductive metal such as copper, nickel or aluminium. Each of the positive and negative terminals may have the form of a foil. A proximal end of each of the positive and negative terminals may extend from the electrochemical arrangement. A proximal end of each of the positive and negative terminals may be electrically coupled, such as by way of welding, to a respective one of the electrodes of the electrochemical arrangement. The measurement arrangement may be contained at least in part within the container. Where the container is sealed, the battery cell may be configured such that each of the positive and negative terminals extends from its respective electrode to outside the container without compromising the seal formed by the container.

The potential difference between the two spaced apart locations may be of the order of mV. The measurement arrangement may therefore comprise an amplifier which is electrically coupled to the two spaced apart locations and is configured to amplify the potential difference between the two spaced apart locations. More specifically the amplifier may be a differential amplifier. The measurement arrangement may also comprise a filter and more specifically a low pass filter. A desired resistance between the two spaced apart locations may not depend alone on the configuration and material characteristics of the terminal or the desire to minimise resistance and thereby reduce power dissipation. A further factor may be a characteristic of an amplifier operative to amplify a signal, such as potential difference, measured at the spaced apart locations. A lower gain amplifier may require a larger resistance between the spaced apart locations which increases power dissipation. On the other hand, a higher gain amplifier reduces resistance between the spaced apart locations whilst increasing amplification of noise and thereby degrading quality of measurement. There may therefore be a compromise involved in respect of determining resistance between the spaced apart locations.

The electric battery may comprise plural sets of battery cells, each set of battery cells comprising plural battery cells. More specifically each set of battery cells may comprise a measurement arrangement, the plural battery cells within a set of battery cells being connected to each other in parallel. Connecting the plural battery cells within a set in parallel causes the resistance of their cell terminals to be seen in parallel whereby the combined resistance of the terminals is reduced by the inverse of the number of battery cells in parallel. The measurement arrangement may be configured such that the potential difference across the combined resistance is measured.

A battery cell may comprise two measurement arrangements with each of the two measurement arrangements being electrically coupled to each of two spaced apart locations on a respective one of the positive and negative terminals of the battery cell. Current may thus be measured in each of the positive and negative terminals of the battery cell whereby redundancy of current measurement may be achieved in view of the current flowing in the positive and negative terminals being substantially the same.

The measurement arrangement may comprise an analogue to digital converter. The measurement arrangement may be configured such that the analogue to digital converter is operative to convert measured potential difference from analogue form to digital form.

The measurement arrangement may comprise a processor such as a microprocessor which is configured to process the measured potential difference. The processor may be configured to convert the measured potential difference to measured current. The measurement arrangement may be further configured to measure cell voltage. More specifically the measurement arrangement may comprise a cell voltage amplifier such as a differential amplifier which is operative to measure a potential difference between positive and negative terminals of the battery cell. The processor may be operative to receive an output from the cell voltage amplifier and to process the output. Where the electric battery comprises a temperature sensor, the processor may be operative to receive an output from the temperature sensor and to process the output.

The measurement arrangement may further comprise a communications circuit which is configured to at least one of provide data to and receive data from the measurement arrangement. The electric battery may be configured such that the communications circuit is operative to convey at least one of data to and data from elsewhere such as a supervisory processor comprised in the electric battery or a measurement arrangement comprised in another battery cell.

The measurement arrangement may be unitary with the battery cell. The electric battery may comprise a circuit board, such as a printed circuit board, comprising the measurement arrangement. The circuit board may be mechanically coupled to the battery cell such that the measurement arrangement couples electrically to the two spaced apart locations on the terminal. The terminal may be attached, such as by way of bonding or clamping, to the circuit board.

The electric battery may comprise a carrier which is configured to support the battery cell. As mentioned above, the measurement arrangement may be unitary with the battery cell. The carrier may comprise the measurement arrangement whereby the measurement arrangement is unitary with the battery cell and its carrier. The carrier may have the form of a printed circuit board. Battery cells may vary in respect of form factor from manufacturer to manufacturer. The carrier may therefore be configured for a battery cell of particular form factor. The measurement arrangement may be of the same form irrespective of the battery cell. Accordingly the measurement arrangement may be mounted on the carrier.

The battery cell may comprise at least one pouch cell. The container may therefore contain one or more pouch cells. Where the container comprises plural pouch cells such that a battery cell is, for example, of prismatic form the positive and negative terminals may be common to the plural pouch cells. A pouch cell may comprise an electrochemical arrangement which is contained within a pouch cell container and more specifically a sealed pouch cell container which may be pliable whereby swelling of the pouch cell container may be allowed for. The electrochemical arrangement may comprise a lithium-ion electrochemical arrangement and more specifically a lithium-ion polymer electrochemical arrangement. The positive and negative terminals may extend from the same end of the electrochemical arrangement. Alternatively the positive and negative terminals may extend from different ends of the electrochemical arrangement and more specifically opposite ends of the electrochemical arrangement.

The present inventors have appreciated that the feature of the circuit board comprising the measurement arrangement may be of wider applicability than hitherto described. Therefore and according to a second aspect of the present invention there is provided an electric battery comprising:
  plural battery cells, each battery cell comprising a container, which contains an electrochemical arrangement, and positive and negative terminals of sheet form extending from the electrochemical arrangement; and
  plural circuit boards each comprising an electrical conductor and a measurement arrangement, each of the plural circuit boards being configured and disposed relative to one of the positive and negative terminals of a respective one of the plural battery cells such that electric current passing through the terminal of the battery cell passes through the electrical conductor, the measurement arrangement being electrically coupled to each of two spaced apart locations on the electrical conductor, the measurement arrangement being configured to measure potential difference between the two spaced apart locations.

The electric battery comprises plural battery cells. Each battery cell comprises a container, which contains an electrochemical arrangement, and positive and negative terminals of sheet form extending from the electrochemical arrangement. The electric battery further comprises plural circuit boards. Each of the plural circuit boards comprises an electrical conductor and a measurement arrangement. The circuit board may comprise a printed circuit board, the printed circuit board defining the electrical conductor. Each of the plural circuit boards is configured and disposed relative to one of the positive and negative terminals of a respective one of the plural battery cells such that electric current passing through the terminal of the battery cell passes through the electrical conductor. The measurement arrangement is electrically coupled to each of two spaced apart locations on the electrical conductor. Furthermore the measurement arrangement is configured to measure potential difference between the two spaced apart locations. Measurement of potential difference between the two spaced apart locations by each measurement arrangement provides for determination of current flowing between the two spaced apart locations and hence current flowing from or to each of the plural battery cells.

The electric battery may further comprise at least one processor configured to receive an output from at least one measurement arrangement and to determine current passing between at least one pair of two spaced apart locations in dependence thereon. More specifically the electric battery may comprise plural processors, each of the plural processors being configured to determine current passing between a respective pair of spaced apart locations. Each of the plural processors may be comprised in and perhaps unitary with a respective one of the plural circuit boards. More specifically the processor may be mounted on the circuit board.

The processor may be configured to determine current passing between the two spaced apart locations in dependence on the measured potential difference and resistance of the electrical conductor between the two spaced apart locations. The resistance of the electrical conductor between the two spaced apart locations may be predetermined. The resistance of the electrical conductor between the two spaced apart locations may depend on a material property of the electrical conductor and dimensions of the electrical conductor between the two spaced apart locations such as separation between the two spaced apart locations, width of the electrical conductor and thickness of the electrical conductor. The resistance of the electrical conductor may be determined before use of the electric battery such as during calibration. The determined resistance may be stored in data storage comprised in the measurement arrangement.

The circuit board may be attached to the battery cell whereby the circuit board and the battery cell are unitary. The circuit board may be disposed relative to the battery cell such that a distal end of the terminal is attached, such as by bonding or clamping, to the circuit board whereby the electrical conductor is in series with the terminal. The distal end of the terminal may constitute one of the two spaced apart locations between which potential difference is measured by the measurement arrangement.

As described above with reference to the first aspect of the present invention the processor may be further configured to at least one of: measure cell voltage; and receive a temperature output from a temperature sensor comprised in the electric battery and to process the temperature output. Alternatively or in addition and as described above the measurement arrangement may further comprise a communications circuit which is configured to at least one of provide data to and receive data from the measurement arrangement.

Further embodiments of the second aspect of the present invention may comprise one or more features of the first aspect of the present invention.

According to a further aspect of the present invention there is provided an electric battery comprising: plural battery cells, each battery cell comprising an electrochemical arrangement, and positive and negative terminals electrically coupled to the electrochemical arrangement; and plural measurement arrangements, each of the plural measurement arrangements being electrically coupled to each of two spaced apart locations on one of the positive and negative terminals of a respective one of the plural battery cells, the measurement arrangement being configured to measure potential difference between the two spaced apart locations.

Further embodiments of the further aspect of the present invention may comprise one or more features of the first or second aspect of the present invention.

BRIEF DESCRIPTION OF DRAWINGS

Further features and advantages of the present invention will become apparent from the following specific description, which is given by way of example only and with reference to the accompanying drawings, in which.

DESCRIPTION OF EMBODIMENTS

Figure 1:
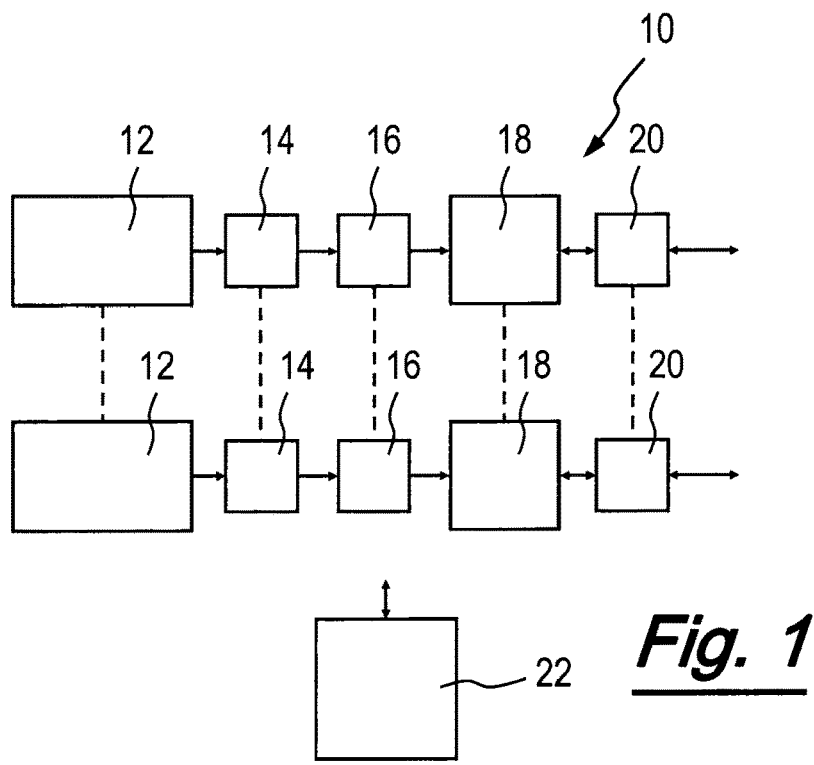
FIG. 1 is a block diagram representation of an electric battery according to the present invention.

A block diagram representation of an electric battery 10 according to the present invention is shown in FIG. 1. The electric battery comprises plural lithium-ion polymer pouch cells 12 (each of which constitutes a battery cell) which are of conventional form and function except as described herein. In another form, a battery cell is constituted by plural pouch cells, as described below with reference to FIG. 4B, which are contained within a container whereby the battery cells is, for example, of prismatic form. As is described in more detail below the electric battery 10 comprises a parasitic resistor for each pouch cell 12. Furthermore and as shown in FIG. 1 the electric battery 10 comprises a differential amplifier 14 for each pouch cell 12 which is operative to amplify a potential difference developed across its respective parasitic resistor. Although not shown in FIG. 1, the electric battery 10 comprises a low pass filter for each pouch cell 12 which is operative to filter signals from its respective differential amplifier 14. The electric battery 10 further comprises for each pouch cell 12 an analogue-to-digital converter 16, a microprocessor 18 and a communications circuit 20. The analogue-to-digital converter 16 is operative to receive the amplified potential difference from the differential amplifier 14 and to convert the amplified potential difference to digital form. The output from the analogue-to-digital converter 16 is then received in the microprocessor 18. As described below in more detail the microprocessor 18 is operative to convert the received digital signal to a current value.

Although not shown in FIG. 1, a temperature sensor, such as a thermocouple or resistance temperature detector (RTD), is disposed near the parasitic resistance of each pouch cell 12. The sensed temperature is subject to signal conditioning, analogue to digital conversion and processing in the microprocessor 18. Although not shown in FIG. 1, the cell voltage of each pouch cell 12 is determined by way of a further differential amplifier which is operative to measure a potential difference between positive and negative terminals of the pouch cell. The measured cell voltage is subject to signal conditioning, analogue to digital conversion and processing in the microprocessor 18. The electric battery 10 further comprises a communications circuit 20 which is operative to receive pouch cell condition data from the microprocessor 18. The pouch cell condition data includes current sourced from or sunk by the pouch cell, the pouch cell voltage and the temperature of the pouch cell. The communications circuit 20 is operative to convey the pouch cell condition data elsewhere. According to a first example the communications circuit 20 is operative to convey the pouch cell condition data to the microprocessor 18 of another pouch cell 12. According to a second example the communications circuit 20 is operative to convey the pouch cell condition data to a supervisory microprocessor 22 comprised in the electric battery 10. According to a third example, the communications circuit 20 is operative to convey the pouch cell condition data externally to the electric battery 10 such as to a remote monitoring facility. The communications circuit 20 is also operative to receive condition data from other communications circuits 20 and control data from the supervisory microprocessor 22 or from the like of the remote monitoring facility.

Figure 2:
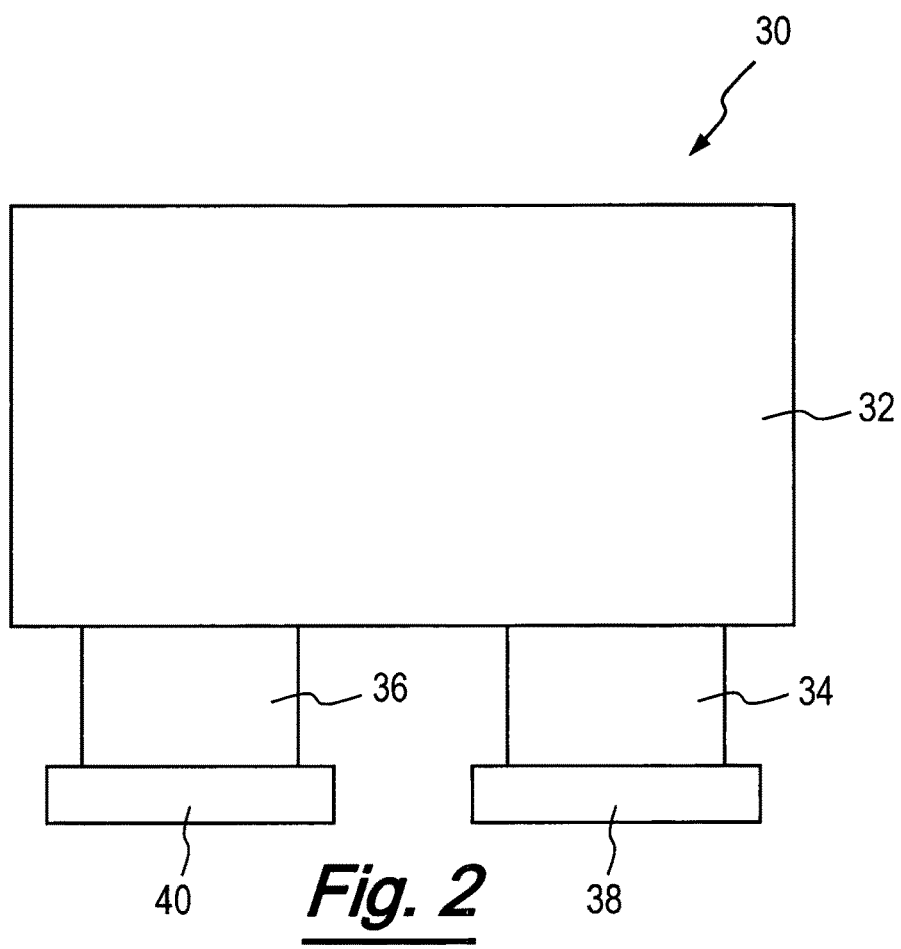
FIG. 2 is a representation of a pouch cell of known form.

A representation of a pouch cell 30 of known form is shown in FIG. 2. The pouch cell 30 is of known form and function and comprises a sealed pliable bag 32 (which constitutes a pouch cell container) containing a lithium-ion polymer electrochemical arrangement which is operative to generate electrical energy from chemical reaction. The pouch cell 30 further comprises a positive terminal 34 and a negative terminal 36 which extend from inside the pliable bag to outside the pliable bag without compromising the seal formed by the pliable bag. The proximal, i.e. internal, end of each positive and negative terminal is electrically coupled to a respective electrode of the electrochemical arrangement. Each positive and negative terminal is a foil formed from copper. In accordance with known practice the positive terminal 34 is electrically connected to a first bus bar 38 and the negative terminal 36 is electrically connected to a second bus bar 40.

Figure 3A:
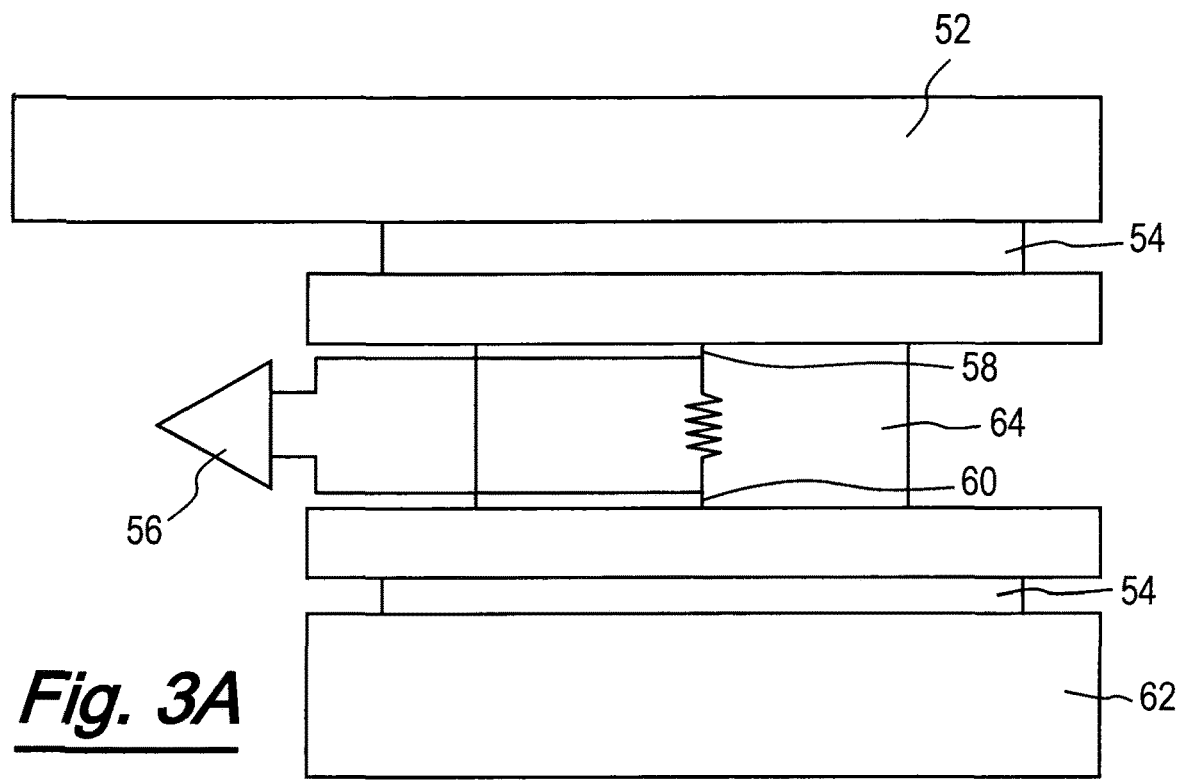
FIG. 3A is a representation of a pouch cell with a measurement arrangement according to a first embodiment of the present invention.

A representation of a pouch cell with a measurement arrangement according to a first embodiment of the present invention is shown in FIG. 3A. The pouch cell of FIG. 3A is as per FIG. 2 in that it comprises a pliable bag 52 which contains an electrochemical arrangement and from which positive and negative terminals extend. For clarity of illustration, only the positive terminal 34, 54 is shown in FIG. 3A. The differential amplifier 14, 56 of FIG. 1 has two inputs. A first input 58 to the differential amplifier 14, 56 is electrically connected to the positive terminal 34, 54 near the pliable bag 52. A second input 60 to the differential amplifier 14, 56 is electrically connected to the terminal 34, 54 near the first bus bar 38, 62. The connections made to the positive terminal 34, 54 by the first and second inputs 58, 60 are therefore spaced apart from each other by a distance L.

The length of positive terminal 34, 54 between the two connections 58, 60 to the terminal constitutes a parasitic resistance across which a potential difference is developed and measured by the differential amplifier 14, 56. The potential difference corresponds to current passing through the positive terminal, i.e. current sourced from or sunk by the pouch cell. To dissipate as little power as possible, it is desirable for the resistance between the two connections to be very low, such as of the order of 200 µΩ. The resistance, R, between the two connections is given by $R=(\rho \cdot L)/(t \cdot W)$ where $\rho$ is the bulk resistivity of the terminal, L is the distance between the two connections, t is the thickness of the terminal and W is the width of the terminal. Here the terminal is formed of aluminium 0.1 mm thick. An aspect ratio of width to length, i.e. W/L, of 1.37 is therefore required to provide a resistance of 200 µΩ. In the embodiment of FIG. 3A the spacing of the two connections is such that the terminal is too wide to achieve an aspect ratio of 1.37. Accordingly and as shown in FIG. 3A the width of the positive terminal 34, 54 is reduced 64 between the two connections to provide an aspect ratio of 1.37.

The bulk resistivity, ρ, of the terminal depends on temperature. Therefore the temperature sensor mentioned above is operative to sense the temperature near the resistance defined between the two connections to the differential amplifier 14, 56. As mentioned above, the sensed temperature is converted to digital form and received in the microprocessor 18. During calibration the resistance defined between the two connections to the differential amplifier 14, 56 is determined and stored in data storage comprised in the microprocessor 18. Furthermore variation in bulk resistivity, ρ, over temperature is stored in a look up table. During use of the electric battery, the microprocessor 18 is operative to determine the current sourced from or sunk by the pouch cell in dependence on the measured potential difference and the measured temperature. According to another calibration approach, a calibration value is determined which converts the output from the analogue-to-digital converter directly to current sourced from or sunk by the pouch cell. During use of the electric battery, the calibration value is adjusted for variation in temperature as determined from the look up table in dependence measured temperature. This approach provides for calibration of the whole measurement and processing chain of FIG. 1.

Figure 3B:
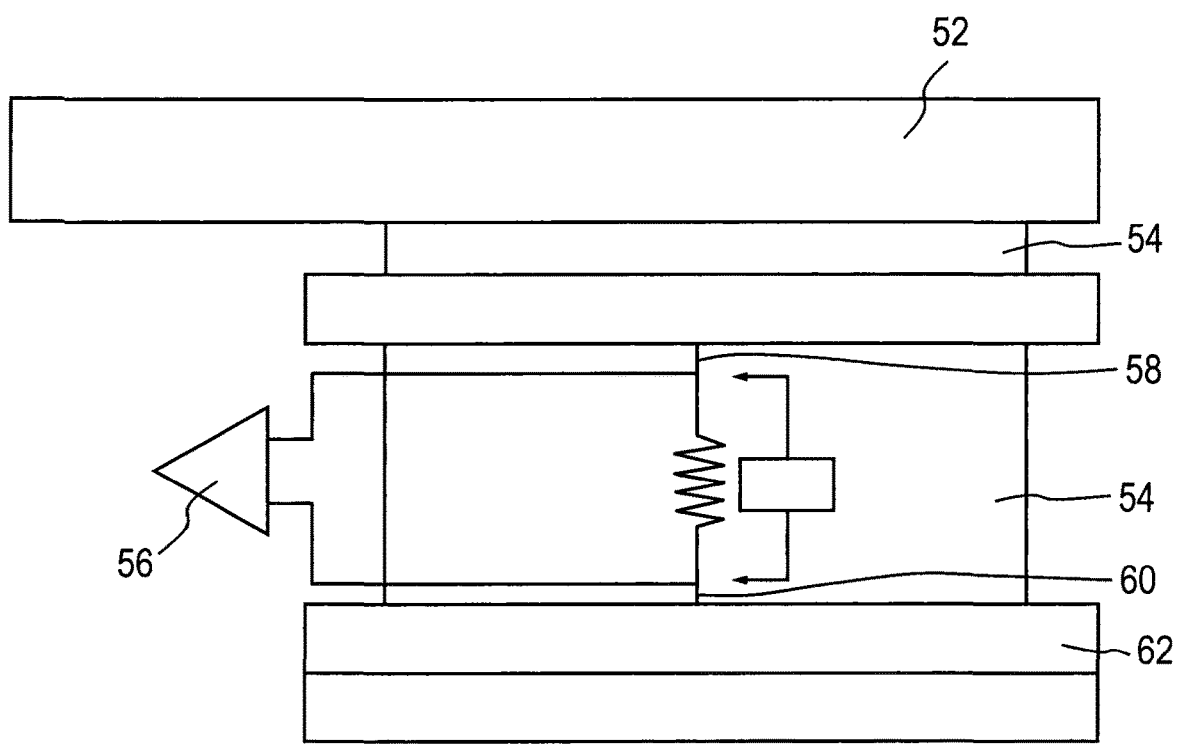
FIG. 3B is a representation of a pouch cell with a measurement arrangement according to a second embodiment of the present invention.

A representation of a pouch cell with a measurement arrangement according to a second embodiment of the present invention is shown in FIG. 3B. Components in common with the first embodiment of FIG. 3A are designated with like reference numerals. The reader's attention is directed to the description provided above with reference to FIG. 3A for a description of such common components. Features of the second embodiment which differ from the first embodiment will now be described. As can be seen from FIG. 3B, the connection to the differential amplifier 60 other than the connection closer to the pliable bag 52 is combined with the first bus bar 62. This change in configuration provides an increase in length of resistance whereby there is no need to reduce the width of the terminal 54 between the two connections to the differential amplifier 60.

Figure 4A:
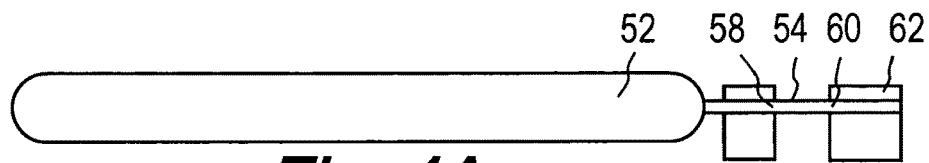
FIG. 4A is a representation in profile of the second embodiment of the present invention.

A representation in profile of the second embodiment is shown in FIG. 4A. Components in common with the second embodiment of FIG. 3B are designated with like reference numerals. The reader's attention is directed to the description provided above with reference to FIG. 3B for a description of such common components.

Figure 4B:
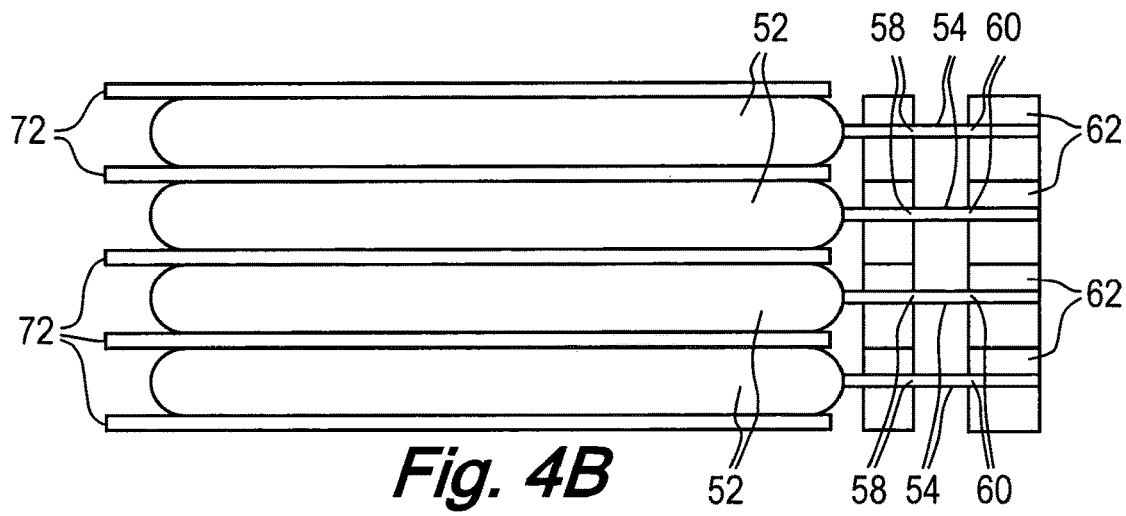
FIG. 4B is a representation in profile of plural pouch cells according to a third embodiment of the present invention.

A representation in profile of plural pouch cells according to a third embodiment of the present invention is shown in FIG. 4B. Components in common with the second embodiment of FIG. 3B are designated with like reference numerals. The reader's attention is directed to the description provided above with reference to FIG. 3B for a description of such common components. Features particular to the embodiment of FIG. 4B will now be described. A cooling plate 72 is present between pairs of adjacent pouch cells 52 and such that the adjacent pouch cells abut against and are supported by the cooling plate 72. In this embodiment a battery cell is constituted by the plural pouch cells 52 shown in FIG. 4B. The positive terminals of the plural pouch cells 52 are electrically connected and the negative terminals of the plural pouch cells are electrically connected whereby the pouch cells are connected in parallel. Measurement of current, voltage and temperature is in respect of each such parallel arrangement of pouch cells.

Figure 5:
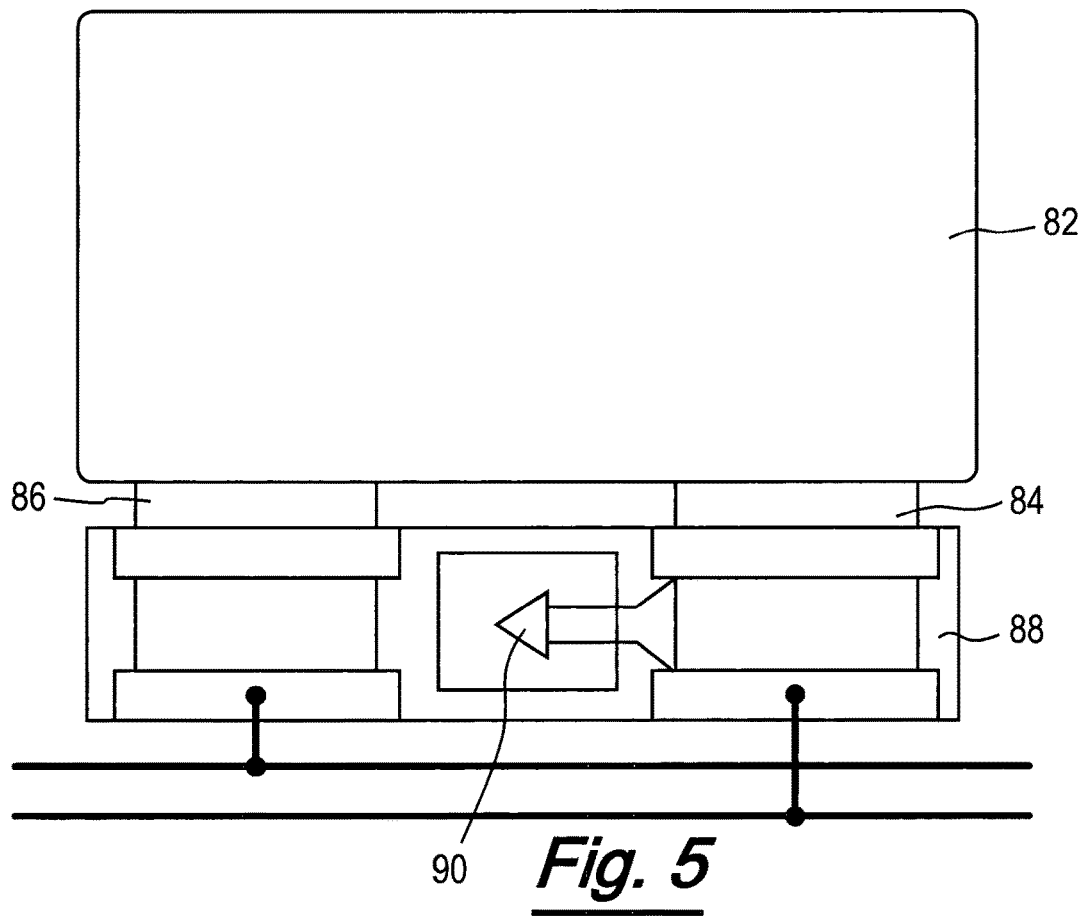
FIG. 5 is a representation of a pouch cell with a measurement arrangement according to a fourth embodiment of the present invention in which a terminal of the pouch cell is used as a sense resistor.

A representation of a pouch cell with a measurement arrangement according to a fourth embodiment of the present invention in which a terminal of the pouch cell is used as a sense resistor is shown in FIG. 5. In the embodiment of FIG. 5 the positive 84 and negative 86 terminals which extend from the pliable bag 82 are bonded or clamped to a printed circuit board 88 comprising the differential amplifier 90 and the further components comprised in the measurement and processing chain and such that the inputs to the differential amplifier 90 make an electrical connection to the positive terminal 84 at spaced apart locations.

Figure 6:
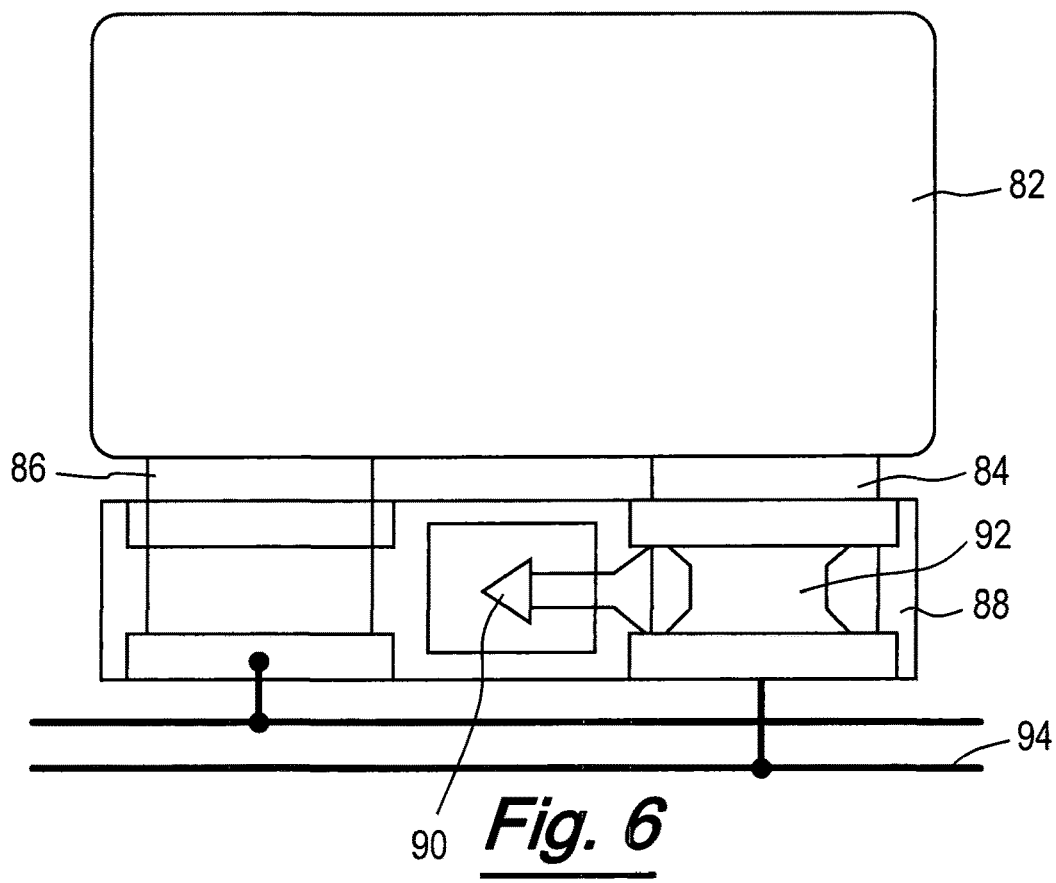
FIG. 6 is a representation of a pouch cell with a measurement arrangement according to a fifth embodiment of the present invention in which a printed circuit board conductor is used as a sense resistor.

A representation of a pouch cell with a measurement arrangement according to a fifth embodiment of the present invention in which a printed circuit board conductor is used as a sense resistor is shown in FIG. 6. Components in common with the fourth embodiment of FIG. 5 are designated with like reference numerals. The reader's attention is directed to the description provided above with reference to FIG. 5 for a description of such common components. Features particular to the embodiment of FIG. 6 will now be described. The printed circuit board 88 comprises a length of electrical conductor 92 which is operative as a sense resistance instead of the positive terminal of the fourth embodiment. Furthermore the positive terminal 84 is clamped or bonded to the printed circuit board 88 such that it makes electrical contact with one end of the length of electrical conductor 92. The other end of the length of electrical conductor 92 is electrically connected to the first bus bar 94. The length of electrical conductor 92 is therefore in series between the positive terminal 84 and the first bus bar 94. The printed circuit board 88 is configured such that the two inputs to the differential amplifier 90 are electrically coupled to respective ends of the length of electrical conductor 92. The dimensions and material properties of the length of electrical conductor 92 determine the resistance seen by the differential amplifier 90.

Figure 7:
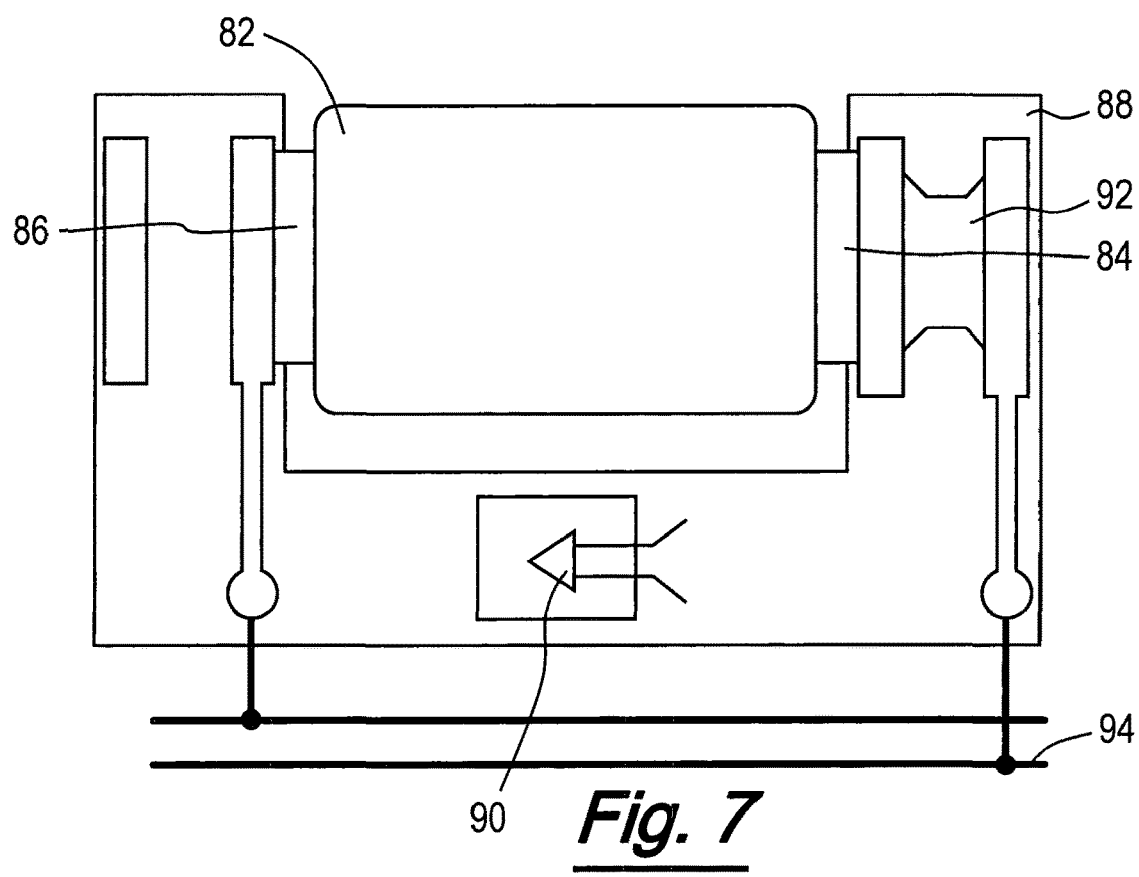
FIG. 7 is a representation of a pouch cell of different configuration with a measurement arrangement according to a sixth embodiment of the present invention.

A representation of a pouch cell of different configuration with a measurement arrangement according to a sixth embodiment of the present invention is shown in FIG. 7. Components in common with the fifth embodiment of FIG. 6 are designated with like reference numerals. The reader's attention is directed to the description provided above with reference to FIG. 6 for a description of such common components. Features particular to the embodiment of FIG. 7 will now be described. As can be seen from FIG. 7 the positive and negative terminals 84, 86 extend from opposite sides of the pliable bag 82. The shape of the printed circuit board 88 is configured accordingly whereby connection of each of the positive and negative terminals 84, 86 is to a respective one of two different arms of the printed circuit board 88.

The invention claimed is:
1. An electric battery comprising:
a plurality of battery cells, each battery cell comprising a container, the container containing an electrochemical arrangement, each battery cell further comprising positive and negative terminals of sheet form extending from the electrochemical arrangement; and
a plurality of measurement arrangements, each of the plurality of measurement arrangements:
being electrically coupled to each of two spaced apart measurement locations on a same positive or negative terminal of a respective battery cell of the plurality of battery cells, and measuring a potential difference between the two measurement locations, whereby the terminal constitutes a current sense resistor between the two measurement locations.

2. The electric battery according to claim 1 determining current passing between the two measurement locations in dependence on the measured potential difference and a resistance between the two measurement locations.

3. The electric battery according to claim 2, wherein the resistance between the two measurement locations is predetermined.

4. The electric battery according to claim 3, wherein the resistance is predetermined in dependence on at least one of: a material property of the terminal or dimensions of the terminal.

5. The electric battery according to claim 4, wherein the material property is bulk resistivity, $\rho$, of the terminal.

6. The electric battery according to claim 5, further comprising a temperature sensor disposed to sense temperature in the vicinity of the terminal, the measurement arrangement adjusting bulk resistivity, $\rho$, in dependence on the temperature sensed when determining the current passing between the two measurement locations.

7. The electric battery according to claim 1, wherein the terminal is of predetermined width and thickness and the two measurement locations are spaced apart from each other by a predetermined amount, whereby the resistance of the terminal between the two measurement locations is predetermined.

8. The electric battery according to claim 7, wherein the terminal is of a non-uniform width whereby the terminal is narrower between the two measurement locations than at or on each side of the two measurement locations.

9. The electric battery according to claim 1, further comprising first and second bus bars to which the positive and negative terminals of the plural battery cells are electrically connected, wherein for each of the plurality of measurement arrangements, one of the two measurement locations at which the measurement arrangement is electrically coupled to the terminal is one of the first or second bus bars.

10. The electric battery according to claim 1, in which each of the positive and negative terminals has the form of a foil.

11. The electric battery according to claim 1, in which a proximal end of each of the positive and negative terminals is electrically coupled to a respective electrode of the electrochemical arrangement, each of the positive and negative terminals extending from its respective electrode to outside the container without compromising a seal formed by the container.

12. The electric battery according to claim 1, comprising a plurality of sets of battery cells, each set of battery cells comprising a respective plurality of battery cells connected to each other in parallel, each set of battery cells comprising one of the plurality of measurement arrangements, the measurement arrangement of each set of battery cells measuring a potential difference across a combined resistance of terminals within the set of battery cells.

13. The electric battery according to claim 1, wherein at least one battery cell of the plurality of battery cells comprises two measurement arrangements with each of the two measurement arrangements being electrically coupled to each of two measurement locations on a same respective positive or negative terminal of the battery cell.

14. The electric battery according to claim 1, wherein each of the plurality of measurement arrangements comprises an analogue to digital converter and a processor, the analogue to digital converter converting measured potential difference from analogue form to digital form and the processor converting the measured potential difference of digital form to measured current.

15. The electric battery according to claim 1, in which the measurement arrangement further measures battery cell voltage.

16. The electric battery according to claim 1, wherein each of the plurality of measurement arrangements further comprises a communications circuit which conveys at least one of data to and data from at least one of: a supervisory processor comprised in the electric battery or a measurement arrangement comprised in another battery cell.

17. The electric battery according to claim 1, in which the measurement arrangement is unitary with the battery cell.

18. The electric battery according to claim 1 comprising a circuit board, the circuit board comprising one of the plurality of measurement arrangements, the circuit board being mechanically coupled to the battery cell such that the measurement arrangement couples electrically to the two measurement locations on the terminal.

19. The electric battery according to claim 1 comprising a carrier supporting the battery cell, the carrier comprising one of the plurality of measurement arrangements, wherein the battery cell, the measurement arrangement, and the carrier are unitarily formed.

20. The electric battery according to claim 1, in which a battery cell comprises at least one pouch cell, each pouch cell comprising an electrochemical arrangement.

21. The electric battery according to claim 1, in which the electrochemical arrangement comprises a lithium-ion polymer electrochemical arrangement.

22. The electric battery according to claim 1, wherein each measurement arrangement comprises an amplifier configured to measure the potential difference between the two measurement locations on the respective terminal and a filter configured to filter signals from the amplifier.

23. The electric battery according to claim 22, wherein the amplifier is a differential amplifier connected to the two measurement locations on the terminal.

24. The electric battery according to claim 22, wherein the filter is a low pass filter.

25. The electric battery according to claim 6, wherein the measurement arrangement comprises data storage storing a look up table of bulk resistivity, p, against temperature and the measurement arrangement adjusting the bulk resistivity, p, in dependence on the sensed temperature using the look up table.

* * * * *